United States Patent
Morgan et al.

(10) Patent No.: US 6,662,349 B2
(45) Date of Patent: Dec. 9, 2003

(54) METHOD OF REPEATER INSERTION FOR HIERARCHICAL INTEGRATED CIRCUIT DESIGN

(75) Inventors: David A. Morgan, Fort Collins, CO (US); Richard D. Blinne, Fort Collins, CO (US); James A. Jensen, Eagan, MN (US); Christopher J. Tremel, St. Louis Park, MN (US)

(73) Assignee: LSI Logic Corporation, Milpitas, CA (US)

( * ) Notice: Subject to any disclaimer, the term of this patent is extended or adjusted under 35 U.S.C. 154(b) by 82 days.

(21) Appl. No.: 10/086,232

(22) Filed: Feb. 27, 2002

(65) Prior Publication Data
US 2003/0163795 A1 Aug. 28, 2003

(51) Int. Cl.$^7$ ............................................. G06F 17/50
(52) U.S. Cl. ............................................. 716/10; 716/8
(58) Field of Search ........................... 716/10, 8, 9, 11, 716/12, 19

(56) References Cited

U.S. PATENT DOCUMENTS

| | | | | |
|---|---|---|---|---|
| 5,995,735 A | * | 11/1999 | Le | 716/13 |
| 6,198,978 B1 | * | 3/2001 | Takahashi | 700/97 |
| 2002/0010901 A1 | * | 1/2002 | Otaguro | 716/12 |
| 2002/0129326 A1 | * | 9/2002 | Nuber et al. | 716/12 |

OTHER PUBLICATIONS

McInerny et al.; "Methodology for Repeater Insertion Management in the RTL, Layout, Floorpan and Fullchip Timing Databases of the Itanium™ Microprocessor", *ISPD* 2000, pp. 99–104.

Sarkar et al.; "Routability–Drive Repeater Block Planning for Interconnect–Centric Floorplanning", *ISPD* 2000, pp. 186–191.

\* cited by examiner

Primary Examiner—Matthew Smith
Assistant Examiner—Sun James Lin
(74) Attorney, Agent, or Firm—Fitch, Even, Tabin & Flannery

(57) ABSTRACT

A method of repeater insertion in a hierarchical integrated circuit includes defining an initial floorplan for a parent macro at a parent level in a hierarchical circuit design; passing outline and pin locations from the parent macro to a child macro sharing a common area with the parent macro; defining or modifying a floor plan for the child macro at a child level in the hierarchical circuit design in response to the outline and pin locations passed from the parent macro; passing physical restrictions in the child macro from the child macro to the parent macro; determining a location for a cell at the parent level of the hierarchical circuit design in an area of the parent macro shared by the child macro in response to the physical restrictions passed from the child macro; passing physical constraints in the parent macro associated with placement and routing of the cell from the parent level to the child macro; and generating an abstract representation for the child macro at the child level that includes an area cut out of the child macro corresponding to the location of the cell.

6 Claims, 2 Drawing Sheets

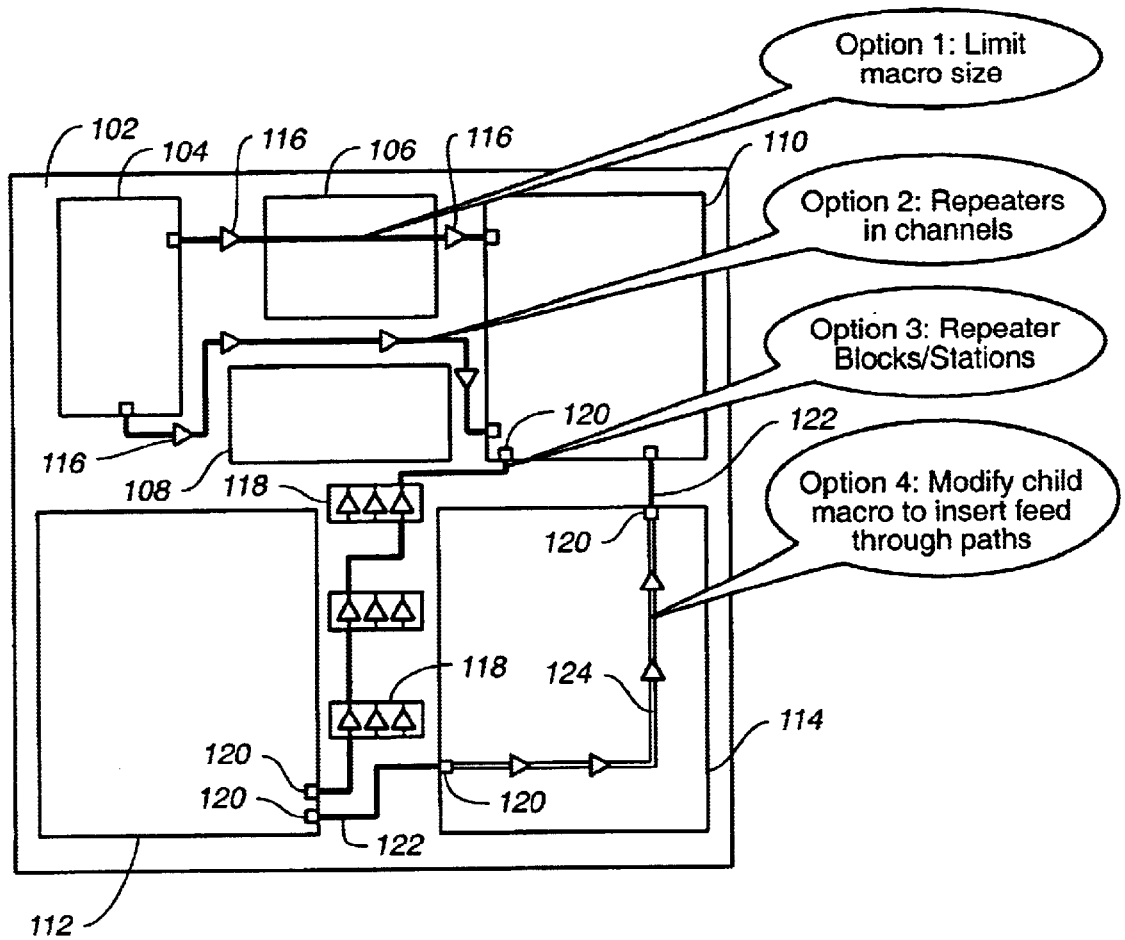
FIG._1
*(PRIOR ART)*

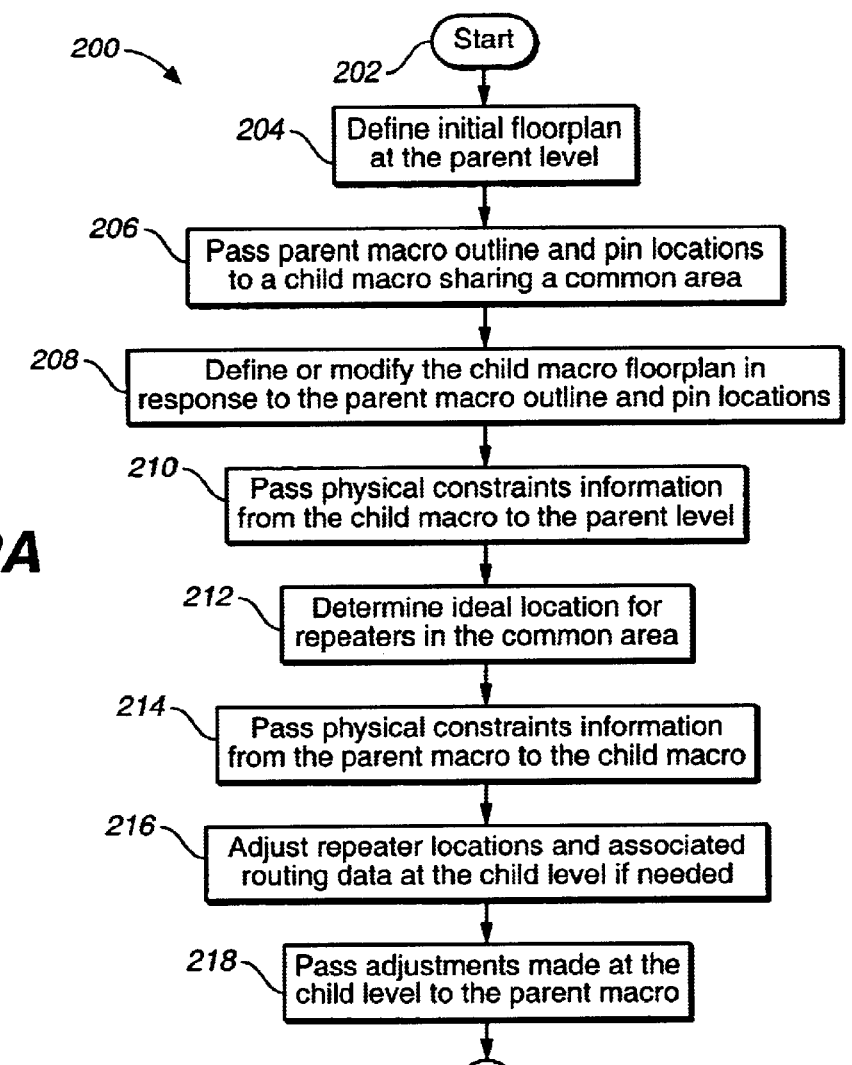
FIG._2A
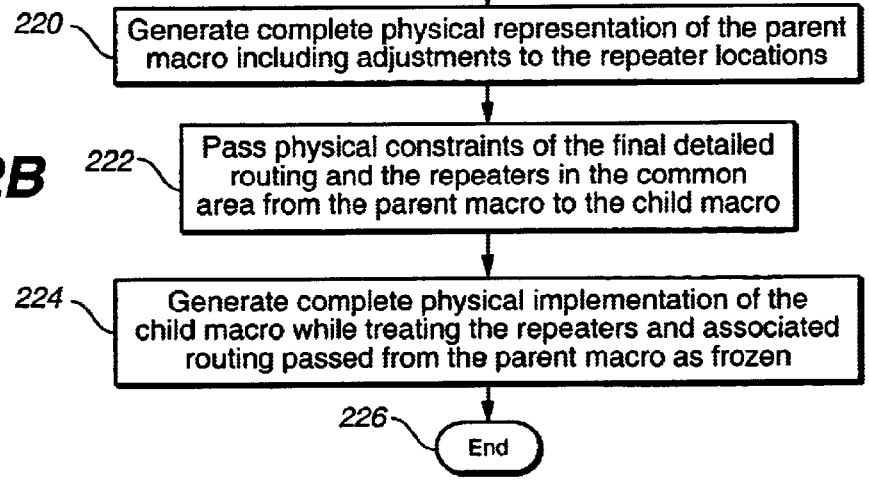
FIG._2B

METHOD OF REPEATER INSERTION FOR HIERARCHICAL INTEGRATED CIRCUIT DESIGN

FIELD OF THE INVENTION

The present invention relates generally to the design of application-specific integrated circuits (ASICs). More specifically, but without limitation thereto, the present invention relates to introducing repeater buffers in a hierarchical design of an integrated circuit.

BACKGROUND OF THE INVENTION

With integrated circuit designs that include a hierarchy of macros each containing one or more "child" macro blocks, it is often necessary to add repeaters for distributing signals to multiple destinations at lower levels in the hierarchical design. Introducing repeaters into the hierarchical design creates problems in floor planning and routing that must be addressed in either electronic design automation (EDA) software or by the circuit designer.

SUMMARY OF THE INVENTION

In one aspect of the present invention, a method of repeater insertion in a hierarchical integrated circuit includes defining an initial floorplan of a parent macro in a hierarchical circuit design; passing outline and pin locations from the initial floorplan from the parent macro to a child macro sharing a common area with the parent macro; defining or modifying a floor plan of the child macro in the hierarchical circuit design in response to the outline and pin locations passed from the parent macro; passing first physical constraints information from the child macro to the parent macro; determining an ideal location for a repeater in the common area in response to the first physical constraints information; passing second physical constraints information associated with repeater placement and routing in the parent macro that overlap the area of the child macro from the parent level to the child macro; and generating a complete physical implementation of the parent macro.

In another aspect of the present invention, a method of repeater insertion in a hierarchical integrated circuit includes defining an initial floorplan of a parent macro in a hierarchical circuit design; passing outline and pin locations from the initial floorplan from the parent macro to a child macro sharing a common area with the parent macro; defining or modifying a floor plan of the child macro in the hierarchical circuit design in response to the outline and pin locations passed from the parent macro; passing first physical constraints information from the child macro to the parent macro; determining an ideal location for a repeater in the common area in response to the first physical constraints information; passing second physical constraints information associated with repeater placement and routing in the parent macro that overlap the area of the child macro from the parent level to the child macro; adjusting the repeater placement to a nearest non-reserved location in the child macro to generate a new repeater location in the child macro; passing the new repeater location from the child macro to the parent macro; excluding an area from an abstract representation of the child macro corresponding to the new repeater location to signify that the new repeater location is not owned by the child macro; adjusting the repeater placement in the parent macro to the new repeater location; and generating a complete physical implementation of the parent macro including the repeater placement inside the area excluded from the abstract representation of the child macro.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a schematic diagram of the four main methods of the prior art for inserting repeaters in hierarchical designs; and FIGS. 2A and 2B illustrate a flow chart of a method of hierarchical repeater insertion according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

FIG. 1 illustrates a schematic diagram of the four main methods of the prior art for inserting repeaters in hierarchical designs. Shown in FIG. 1 are a parent macro 102, child macros 104, 106, 108, 110, 112, and 114, repeaters 116, repeater blocks 118, macro pins 120, parent macro routing 122, and child macro routing 124.

The parent macro 102 contains several child macros 104, 106, 108, 110, 112, and 114. Each of the child macros 104, 106, 108, 110, 112, and 114 may also be parents of child macros (not shown) contained inside the child macros 104, 106, 108, 110, 112, and 114, and so on, thus defining the hierarchical design. The repeaters 116 buffer signals between the macro pins 120 of the child macros 104, 106, 108, 110, 112, and 114 via the parent macro routing 122 and the child macro routing 124. Although repeaters 116 are used in the examples described, other types of cells in addition to repeaters and buffers may be used to practice the present invention to suit specific applications.

Four options are illustrated in FIG. 1 for controlling the placement of the repeaters 116 and associated routing via the parent macro routing 122 and the child macro routing 124. Option 1 is to restrict the maximum size of the child macro 106 to ensure that no wires routed across the child block 106 exceed the maximum allowable length of a wire without buffering. Option 2 is to disallow repeater placement in areas that are occupied by child macro blocks 104 and 106 and to force placement of the repeaters 116 and associated routing in the channels between the child blocks 104 and 106. Option 3 is to introduce the repeater blocks 118 as part of the floor plan at the parent level and to redirect all long routes through the series of repeater blocks 118. Option 4 is to modify the gate level description of the child macro 114 to include feed-through paths and landing areas for the required number of repeaters 116.

Disadvantages of these methods include the following:

If option 1 is used, restricting the maximum size of the child macro 104 may force additional design partitioning into smaller blocks, resulting in increased overhead associated with data management and area penalties associated with additional channels in the floorplan.

If option 2 is used, inserting repeaters 116 in the channels between the child blocks 104 and 106 forces routing around the child macro block 106 that may be larger than the unbuffered wire length allowed by the technology, resulting in longer overall paths with correspondingly lower performance characteristics and less efficient use of area due to the requirement of wide channels to accommodate the repeaters 116 and associated routing for power/ground supplies.

If option 3 is used, introducing the repeater blocks 118 in the floor plan suffers from the same problems as option 2, except that instead of optimally placing the repeaters 116 where needed, resources, namely the size of the repeater blocks 118 and the parent macro routing 122 needed to connect them, must be preserved during floorplanning, often resulting in unused repeaters; also, since the repeater blocks 118 may only be available in specific locations of the floorplan, longer overall routing may result.

If option 4 is used, forcing the circuit designer to modify the gate level description of the child macro 114 presents new problems, for example:

(a) It is difficult for the circuit designer to know a priori where the repeaters 116 are needed. As a result, iterations between logic design and physical design are required to determine where to place the repeaters 116.

(b) Because feed-through paths do not have clocked elements (flip-flops), it is difficult to establish a time budget for these paths and to manage timing relationships between the child macros and the parent macro.

(c) The interfaces to the child macro 114 must be changed, making formal verification, or equivalence checking, much more difficult in post layout processing.

Option 4 has the advantage over the other three in that assuming the circuit designer is willing to accept the extra labor involved in managing the changes to the parent and child level macros, a better overall path delay may be achieved that is closer to the minimal time-of-flight solution, that is, the repeaters may be placed closer to the ideal locations (which may be in the child macro) to achieve a shorter overall signal path.

The present invention overcomes the limitations of the previous methods while enabling path delays that approach the minimal time-of-flight implementation for long wires. An important feature of the present invention, in contrast to the methods illustrated in FIG. 1, is that near optimal repeater placement may be obtained by allowing repeaters to overlap child macro blocks, while retaining "ownership" of the repeaters and associated wires by the parent macro, that is, the repeaters and associated routing are part of the floorplan of the parent macro. As a result, the logic interfaces of the child macros are preserved, that is, no new logical input or output ports are added to the child blocks to accommodate the wires or the repeaters. Also, many downstream operations in the design process are greatly simplified during and after layout. The layout is the physical implementation of the circuit design. Examples of downstream operations that are simplified by the hierarchical repeater insertion tool of the present invention are timing budget and constraint management and formal logic verification (equivalence checking) in a hierarchical design.

If feedthrough paths are created inside the child macro to implement repeater wiring needed at the parent level in accordance with option 4, then not only must the parent macro netlist and the physical representation be updated to reflect the new hierarchical ports, nets/wires, and repeater instances, but also the path timing must be managed at multiple levels of the hierarchical design. Specifically, at the parent level, there must be a timing model description for the repeater path in the child macro timing model, and the overall timing budget/constraints have to be allocated between two top level repeater path segments. The first repeater path segment is the portion of the repeater path in the parent macro prior to entering the child macro and the portion of the repeater path in the parent macro after exiting the child macro, and the second repeater path segment is the portion of the repeater path inside the child macro.

Presently available physical design tools cannot optimize the entire repeater path in both the parent macro and the child macro in a single pass. Instead, the portions of the repeater path that exist at the parent level may be optimized in a first pass of the tool at the parent level while fixing the timing associated with the portion of the path inside the child macro via an abstracted timing model for the child macro. An additional pass of the tool may be performed at the child macro level using fixed input arrival times and output timing constraints at the boundary between the child macro and the parent macro. However, this is extremely inefficient and may result in many iterations between the parent and the child levels, ultimately resulting in sub-optimal physical optimization of the repeater path. By retaining ownership of the repeater path at the parent level, the entire repeater path may be analyzed and optimized in a single pass of repeater sizing, insertion, and/or deletion along the repeater path. Deletion of a repeater may occur as a result of other changes in the path. For example, if a buffer having a higher drive strength was inserted earlier in the path, then a longer length of wire may be driven before a repeater is required.

Many modern application-specific integrated circuit (ASIC) design flows incorporate formal logic verification, or equivalence checking, to ensure that the functionality of the design is preserved in the physical implementation, despite the many gate-level transformations that occur during layout, for example, clock tree insertion, logic restructuring, and gate sizing and buffering. Most equivalence checking tools support the concept of hierarchical equivalence checking, in which larger portions of the circuit design are divided into smaller portions for comparison, followed by a top level equivalence check. The hierarchical approach improves user productivity and avoids capacity limitations that may occur with a single "flat" equivalence check performed on the entire circuit design.

If additional paths are added to a child macro, however, equivalence is not preserved. While it is possible to ignore the additional paths during the macro-level equivalence check, a functional inequivalence may be introduced at the design level, because the lower level macros are typically "black-boxed" after equivalence has been verified. A "black-boxed" representation of a circuit element means that the details of the implementation inside the circuit element are not visible or recognized in the context in which the representation is used. For equivalence checking, only the connections to and from the circuit element are checked, not the contents of the circuit element. Therefore, the equivalence checking of the feedthrough repeater paths must also be disabled at the parent level, or else a functional model must be created for the child block describing the Boolean functionality of the additional paths.

In one aspect of the present invention, a method of hierarchical repeater insertion includes defining an initial floorplan for a parent macro at a parent level in a hierarchical circuit design; passing outline and pin locations from the parent-macro to a child macro sharing a common area with the parent macro; defining or modifying a floor plan for the child macro at a child level in the hierarchical circuit design in response to the outline and pin locations passed from the parent macro; passing physical restrictions in the child macro from the child macro to the parent macro; determining a location for a cell at the parent level of the hierarchical circuit design in an area of the parent macro shared by the child macro in response to the physical restrictions passed from the child macro; passing physical constraints in the parent macro associated with placement and routing of the cell from the parent level to the child macro; and generating an abstract representation for the child macro at the child level that excludes an area cut out of the child macro corresponding to the location of the cell.

In the embodiments of the hierarchical repeater insertion tool of the present invention illustrated herein, the child macros are designed and implemented concurrently with the parent level design implementation, that is, the child macros have not been previously completely implemented (laid out) and fixed (frozen). However, in other embodiments, macros may be used which have been previously laid out and frozen, as long as adequate provisions have been made at the time the macro was implemented to reserve resources (landing areas) for repeaters to be placed at the parent level. A landing area is a location where a repeater may be placed and routed by the parent macro. Consequently, no blockage resulting from placement or routing may be imposed by the child macro in a landing area.

FIGS. 2A and 2B illustrate a flow chart 200 of a method of repeater insertion in a hierarchical integrated circuit according to an embodiment of the present invention.

Step 202 is the entry point for the flow chart 200.

In step 204, the initial floorplan is defined at the parent level according to well known floorplanning techniques.

In step 206, the outline and pin locations of the parent macro are passed from the parent level to a child macro sharing a common area with the parent macro.

In step 208, the child macro floor plan is defined or modified at the child level in response to and in compliance with the outline and pin locations passed from the parent level.

In step 210, physical constraints information, that is, locations specifically reserved by the child macro that may not be used by higher level macros in the hierarchical design, is passed from the child macro to the parent level. Early in the parent level design implementation, placement blockages or restrictions from the child macro floor plan associated with areas that cannot be occupied by repeaters must be communicated to the parent level to ensure that the initial ideal repeater/buffer placement specified by the repeater insertion tool run at the parent level complies with the placement restrictions in the common area shared by the child macro. For example, these placement restrictions may represent embedded memory blocks, analog/mixed-signal blocks, pre-existing hard intellectual property (IP) blocks inside the child macro, and other areas inside the child macro that are restricted for general standard cell placement, such as areas near the edges of the child macro.

In step 212, the ideal locations are determined for the repeaters in the area of the parent macro shared by the child macro in response to and in compliance with the placement restrictions passed from the child macro.

In step 214, the physical constraints associated with the repeater placement and routing in the parent macro that overlap the area of the child macro are passed from the parent level to the child macro. Examples of the physical constraints passed from the parent macro to the child macro include repeater wire routing that may be virtual (global), or detailed. In global routing, a virtual representation that indicates the approximate path for a wire route is created, but the actual wire representation is not created or inserted into a database. In detailed routing, representations of the actual wire segments and associated vias and contacts are created and stored in the database. During global routing, there may be violations of physical design rules, such as overlapping routes on the same metal layer, however, any physical design rule violations must be resolved and corrected during the detailed routing.

In step 216, the repeater locations and associated wire routing data passed from the parent macro to the child macro are legalized in the child context to accommodate the row alignment and orientation in the vicinity of the ideal location specified at the parent level. This is done by adjusting and re-orienting the repeater to the nearest legal, that is, non-reserved, location within the child macro context. As an alternative, this step and the following step may be avoided by passing additional information, that is, row locations and orientation, from the child macro to the parent level along with the physical constraints, so that the initial placement of the repeater is legal.

In step 218, if the repeater placement was changed in the child context, the new repeater location is passed from the child macro back to the parent macro, so that the corresponding adjustment may be made at the parent level. As part of the abstraction process for the child macro, areas are cut out of the child macro and excluded from the abstract representation of the child macro to signify that the placement of the repeaters in the area of the child macro at the parent level is not interpreted as overlapping an area "owned", or reserved, by the child macro.

In step 220, the complete physical implementation is generated at the parent level, including the repeater placement inside the areas excluded from the abstract representation of the child macro and, if necessary, any repairs of the associated detailed routing.

In step 222, the physical constraints of the detailed routing and the repeaters in the common area shared by the parent macro with the child macro are passed from the parent macro to the child macro.

In step 224, the complete physical implementation of the child macro is performed, while treating the repeaters and associated routing passed from the parent as "fixed" (frozen).

Step 226 is the exit point for the flow chart 200. Post layout verification may then be performed for the physical implementation according to well known techniques.

The steps performed in the example of the flow chart 200 may be implemented by the Hierarchical Contstraint Tool developed by LSI Logic Inc. and by integrated circuit design tools such as Avanti—Apollo or Astro.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by instructions for a computer according to well known programming techniques to perform the following functions: defining an initial floorplan for a parent macro at a parent level in a hierarchical circuit design; passing outline and pin locations from the parent macro to a child macro sharing a common area with the parent macro; defining or modifying a floor plan for the child macro at a child level in the hierarchical circuit design that complies with the outline and pin locations passed from the parent macro; passing physical restrictions in the child macro from the child macro to the parent macro; determining a location for a cell at the parent level of the hierarchical circuit design in an area of the parent macro shared by the child macro that complies with the physical restrictions passed from the child macro; passing physical constraints in the parent macro associated with placement and routing of the cell from the parent level to the child macro; and generating an abstract representation for the child macro at the child level that excludes an area cut out of the child macro corresponding to the location of the cell.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of hierarchical repeater insertion comprising:

defining an initial floorplan of a parent macro in a hierarchical circuit design;

passing outline and pin locations from the initial floorplan from the parent macro to a child macro sharing a common area with the parent macro;

defining or modifying a floor plan of the child macro in the hierarchical circuit design in response to the outline and pin locations passed from the parent macro;

passing first physical constraints information from the child macro to the parent macro;

determining an ideal location for a repeater in the common area in response to the first physical constraints information;

passing second physical constraints information associated with repeater placement and routing in the parent macro that overlap the area of the child macro from the parent level to the child macro; and generating a complete physical implementation of the parent macro.

2. A method of hierarchical repeater insertion comprising:

defining an initial floorplan of a parent macro in a hierarchical circuit design;

passing outline and pin locations from the initial floorplan from the parent macro to a child macro sharing a common area with the parent macro;

defining or modifying a floor plan of the child macro in the hierarchical circuit design in response to the outline and pin locations passed from the parent macro;

passing first physical constraints information from the child macro to the parent macro;

determining an ideal location for a repeater in the common area in response to the first physical constraints information;

passing second physical constraints information associated with repeater placement and routing in the parent macro that overlap the area of the child macro from the parent level to the child macro;

generating a complete physical implementation of the parent macro; and passing third physical constraints information of final detailed routing and repeaters placed in the common area from the parent macro to the child macro.

3. The method of claim 2 further comprising generating a complete physical implementation of the child macro at the child level in response to the third physical constraints information of locations of the repeaters and the final detailed routing passed from the parent macro.

4. A method of hierarchical repeater insertion comprising:

defining an initial floorplan of a parent macro in a hierarchical circuit design;

passing outline and pin locations from the initial floorplan from the parent macro to a child macro sharing a common area with the parent macro;

defining or modifying a floor plan of the child macro in the hierarchical circuit design in response to the outline and pin locations passed from the parent macro;

passing first physical constraints information from the child macro to the parent macro;

determining an ideal location for a repeater in the common area in response to the first physical constraints information;

passing second physical constraints information associated with repeater placement and routing in the parent macro that overlap the area of the child macro from the parent level to the child macro;

adjusting the repeater placement to a nearest non-reserved location in the child macro to generate a new repeater location in the child macro;

passing the new repeater location from the child macro to the parent macro;

excluding an area from an abstract representation of the child macro corresponding to the new repeater location to signify that the new repeater location is not owned by the child macro;

adjusting the repeater placement in the parent macro to the new repeater location; and generating a complete physical implementation of the parent macro including the repeater placement inside the area excluded from the abstract representation of the child macro.

5. A method of hierarchical repeater insertion comprising:

defining an initial floorplan of parent macro in a hierarchical circuit design;

passing outline and pin locations from the initial floorplan from the parent macro to a child macro sharing a common area with the parent macro;

defining or modifying a floor plan of the child macro in the hierarchical circuit design in response to the outline and pin locations passed from the parent macro;

passing first physical constraints information from the child macro to the parent macro;

determining an ideal location for a repeater in the common area in response to the first physical constraints information;

passing second physical constraints information associated with repeater placement and routing in the parent macro that overlap the area of the child macro from the parent level to the child macro;

adjusting the repeater placement to a nearest non-reserved location in the child macro to generate a new repeater location in the child macro;

passing the new repeater new location from the child macro to the parent macro;

excluding an area from an abstract representation of the child macro corresponding to the new repeater location to signify that the new repeater location is not owned by the child macro;

adjusting the repeater placement in the parent macro to the new repeater location;

generating a complete physical implementation of the parent macro including the repeater placement inside the area excluded from the abstract representation of the child macro; and passing third physical constraints information of final detailed routing and repeaters placed in the common area from the parent macro to the child macro.

6. The method of claim 5 further comprising generating a complete physical implementation of the child macro at the child level in response to the third physical constraints information of locations of the repeaters and the final detailed routing passed from the parent macro.

* * * * *